(12) United States Patent
Decottignies et al.

(10) Patent No.: US 12,232,299 B2
(45) Date of Patent: Feb. 18, 2025

(54) METHODS AND APPARATUS FOR COOLING A SUBSTRATE SUPPORT

(71) Applicant: Applied Materials, Inc., Santa Clara, CA (US)

(72) Inventors: Robert Irwin Decottignies, San Carlos, CA (US); Roger Bradford Fish, Bedford, MA (US); Steven Szudarski, Pocatello, ID (US); Shane Lawrence Kintner, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 310 days.

(21) Appl. No.: 17/964,668

(22) Filed: Oct. 12, 2022

(65) Prior Publication Data

US 2024/0130082 A1   Apr. 18, 2024

(51) Int. Cl.
*H05K 7/20* (2006.01)
*H01L 21/67* (2006.01)

(52) U.S. Cl.
CPC ... *H05K 7/20318* (2013.01); *H01L 21/67109* (2013.01); *H05K 7/20372* (2013.01); *H05K 7/20409* (2013.01)

(58) Field of Classification Search
CPC ........... H05K 7/20318; H05K 7/20372; H05K 7/20409
See application file for complete search history.

(56) References Cited

U.S. PATENT DOCUMENTS

| 7,244,311 B2 | 7/2007 | Fischer |
| 9,034,771 B1 | 5/2015 | Nangoy |
| 9,719,169 B2 | 8/2017 | Mohn et al. |
| 9,859,145 B2 | 1/2018 | Fischer et al. |
| 2004/0187787 A1* | 9/2004 | Dawson ............ H01L 21/67248 118/728 |
| 2008/0017104 A1* | 1/2008 | Matyushkin ........ H01L 21/6831 118/58 |
| 2015/0059981 A1* | 3/2015 | Huston .................... C23C 16/46 118/733 |
| 2015/0221553 A1 | 8/2015 | Ouye |
| 2018/0174869 A1* | 6/2018 | Ha ...................... C23C 16/4411 |
| 2020/0123649 A1* | 4/2020 | Ono ..................... C23C 14/5853 |

OTHER PUBLICATIONS

PCT International Search Report and Written Opinion for PCT/US2023/034786 dated Jan. 29, 2024.

\* cited by examiner

*Primary Examiner* — Jason L Vaughan
*Assistant Examiner* — Amanda Kreiling
(74) *Attorney, Agent, or Firm* — Moser Taboada

(57) ABSTRACT

Methods and apparatus for processing a substrate are provided herein. For example, an apparatus for processing a substrate comprises a process chamber configured to process a substrate, a substrate support comprising a heat sink configured to cool the substrate support during operation and a water trap panel comprising a pumping ring configured to cool the water trap panel such that the water trap panel condenses water vapor molecules and drops a process chamber pressure during operation, and a chiller operably coupled to the substrate support and configured to supply a cooling fluid to the substrate support via a cooling fluid line that connects to the heat sink and the pumping ring via a serial configuration or a parallel configuration.

20 Claims, 5 Drawing Sheets

METHODS AND APPARATUS FOR COOLING A SUBSTRATE SUPPORT

FIELD

Embodiments of the present disclosure generally relate to methods and apparatus for cooling a substrate support.

BACKGROUND

Conventional methods and apparatus for substrate processing are known. For example, film growth processes, typically, require relatively high vacuum levels (e.g., 1.0E-9 Torr) for optimal film deposition. During such processes large temperature distribution can sometimes occur when a secondary cooling fluid (e.g., cryogenic water trap) is used from one side of a process chamber. As a result, vacuum levels can be impacted by water molecules that develop in the process chamber. Accordingly, the water molecules need to be pumped continuously.

Therefore, the inventors describe herein improved methods and apparatus for cooling a substrate support.

SUMMARY

Methods and apparatus for processing a substrate are provided herein. In some embodiments, an apparatus for processing a substrate comprises a process chamber configured to process a substrate, a substrate support comprising a heat sink configured to cool the substrate support during operation and a water trap panel comprising a pumping ring configured to cool the water trap panel such that the water trap panel condenses water vapor molecules and drops a process chamber pressure during operation, and a chiller operably coupled to the substrate support and configured to supply a cooling fluid to the substrate support via a cooling fluid line that connects to the heat sink and the pumping ring via a serial configuration or a parallel configuration.

In accordance with at least some embodiments, a method of processing a substrate comprises supplying a cooling fluid through a heat sink coupled to a substrate support for cooling the substrate support and supplying the cooling fluid through a pumping ring of a water trap panel to cool the water trap panel for condensing water vapor molecules on the water trap panel to drop a process chamber pressure, wherein the cooling fluid is supplied via one of a serial configuration or a parallel configuration.

In accordance with at least some embodiments, a non-transitory computer readable storage medium has instructions stored thereon that when executed by a processor perform a method of processing a substrate comprises supplying a cooling fluid through a heat sink coupled to a substrate support for cooling the substrate support and supplying the cooling fluid through a pumping ring of a water trap panel to cool the water trap panel for condensing water vapor molecules on the water trap panel to drop a process chamber pressure, wherein the cooling fluid is supplied via one of a serial configuration or a parallel configuration.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
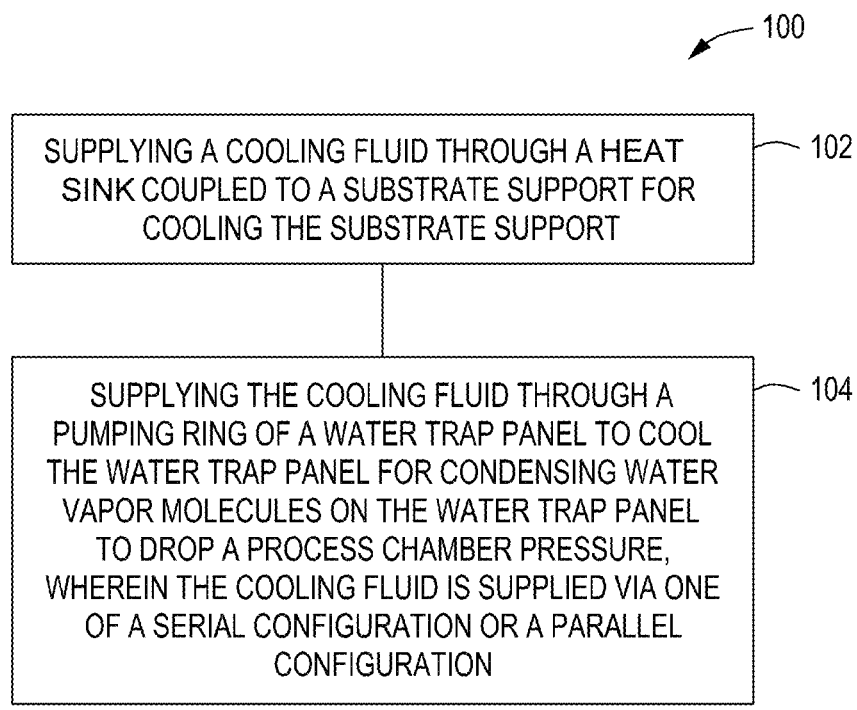
FIG. 1 is a flowchart of a method for processing a substrate, in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus for cooling a substrate support (e.g., pedestal) are provided herein. For example, a process chamber configured to process a substrate can comprise a substrate support which comprises a heat sink (e.g., a cooling ring) configured to cool the substrate support during operation and a water trap panel comprising a pumping ring configured to cool the water trap panel such that the water trap panel condenses water vapor molecules and drops a process chamber pressure during operation. A chiller operably coupled to the substrate support is configured to supply a cooling fluid to the substrate support via a cooling fluid line that connects to the heat sink and the pumping ring via a serial configuration or a parallel configuration. The methods and apparatus described herein provide very low temperature heat sinking for cooling processes. For example, the methods and apparatus described herein provide a convenient way to pump water symmetrically in an ultra-high vacuum environment using one or more cooling fluids (e.g., at least one of polycold refrigerant or liquid nitrogen refrigerant, not shown) to cool a substrate support (e.g., a pedestal and/or electrostatic chuck (ESC)). When compared to conventional methods and apparatus, the methods and apparatus described herein can provide multiple substrate processing support functions (e.g., material heatsinking, vacuum water pumping, and cooling fluid sealing features) in a single integrated unit (e.g., a single welded assembly).

Figure 2:
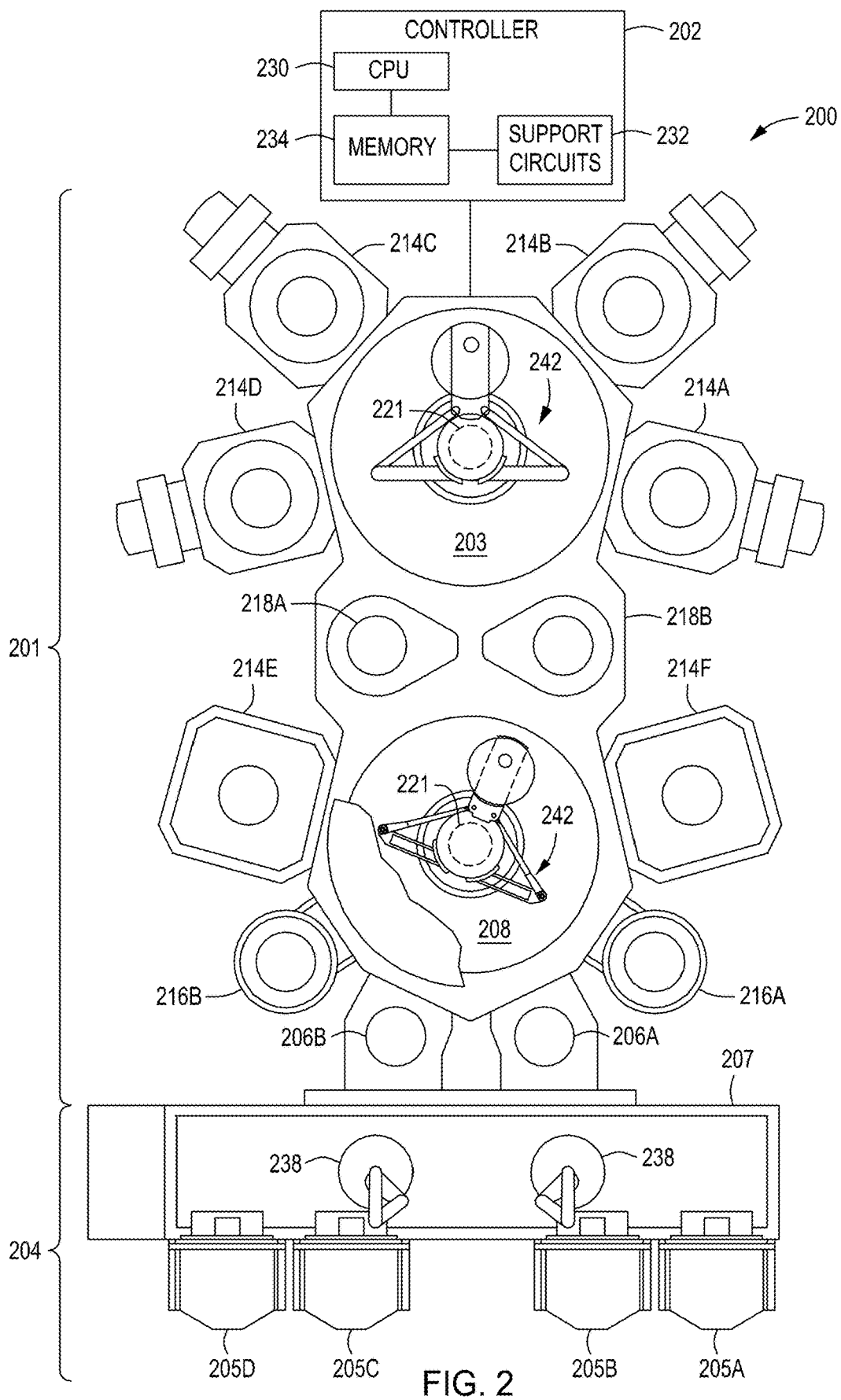
FIG. 2 is a diagram of an apparatus for performing the method of FIG. 1, in accordance with at least some embodiments of the present disclosure.

FIG. 1 is a flowchart of a method 100 for processing a substrate, and FIG. 2 is a tool 200 (or apparatus) that can be used for carrying out the method 100, in accordance with at least some embodiments of the present disclosure.

The method 100 may be performed in the tool 200 which can include any suitable process chambers configured for one or more of physical vapor deposition (PVD), chemical vapor deposition (CVD) and/or atomic layer deposition (ALD), such as plasma enhanced ALD or thermal ALD (e.g., no plasma formation). Examples of processing systems that may be used to perform the inventive methods disclosed herein may include, but are not limited to, the one or more process chambers commercially available from Applied Materials, Inc., of Santa Clara, California. Other process chambers, including those from other manufacturers, may also be suitably used in connection with the teachings provided herein.

The tool 200 can be embodied in individual process chambers that may be provided in a standalone configuration or as part of a cluster tool, for example, an integrated tool (the tool 200) described below with respect to FIG. 2. Examples of the integrated tool can include, but are not limited to, the one or more process chambers commercially available from Applied Materials, Inc., of Santa Clara, California. The methods described herein may be practiced using other cluster tools having suitable process chambers coupled thereto, or in other suitable process chambers. For example, in some embodiments, the inventive methods discussed above may be performed in an integrated tool such that there are limited or no vacuum breaks between processing steps. For example, reduced vacuum breaks may limit or prevent contamination (e.g., oxidation) of one or more metal layers or other portions of the substrate.

The integrated tool includes a processing platform 201 (vacuum-tight processing platform), a factory interface 204, and a controller 202. The processing platform 201 comprises multiple process chambers, such as 214A, 214B, 214C, and 214D operatively coupled to a transfer chamber 203 (vacuum substrate transfer chamber) and process chambers 214E and 214F operatively coupled to a buffer chamber 208 (vacuum substrate buffer chamber).

The factory interface 204 is operatively coupled to the buffer chamber 208 by one or more load lock chambers (two load lock chambers, such 206A and 206B shown in FIG. 2). In at least some embodiments, one of the buffer chamber 208 or the transfer chamber 203 of the tool 200 can omitted. One or more modules or channels can be provided between the buffer chamber 208 and the transfer chamber 203 and can be configured to receive one or more substrates from the buffer chamber 208 and/or the transfer chamber 203. In at least some embodiments, a module 218A and a module 218B are provided between the buffer chamber 208 and the transfer chamber 203 and are configured to receive one or more substrates from the buffer chamber 208 and/or the transfer chamber 203 during operation, as will be described in greater detail below. As noted above, the module 218A and a module 218B can have transparent cover.

In some embodiments, the factory interface 204 comprises a docking station 207, a factory interface robot 238 to facilitate the transfer of one or more semiconductor substrates (wafers). The docking station 207 is configured to accept one or more front opening unified pod (FOUP). Four FOUPS, such as 205A, 205B, 205C, and 205D are shown in the embodiment of FIG. 2. The factory interface robot 238 is configured to transfer the substrates from the factory interface 204 to the processing platform 201 through the load lock chambers, such as 206A and 206B. Each of the load lock chambers 206A and 206B have a first port coupled to the factory interface 204 and a second port coupled to the transfer chamber 203. The load lock chambers 206A and 206B are coupled to a pressure control system (not shown) which pumps down and vents the load lock chambers 206A and 206B to facilitate passing the substrates between the vacuum environment of the buffer chamber 208 and the substantially ambient (e.g., atmospheric) environment of the factory interface 204. In at least some embodiments, the buffer chamber 208 can be maintained at a substantially ambient environment. In embodiments when the buffer chamber 208 is not used, the load lock chambers 206A and 206B facilitate passing the substrates between the transfer chamber 203 and the factory interface 204. The buffer chamber 208 and the transfer chamber 203 each have a vacuum robot 242 positioned to transfer/receive one or more substrates. For example, the vacuum robot 242 of the buffer chamber 208 is capable of receiving/transferring the substrates 221 between the load lock chambers 206A and 206B, the process chambers 214E and 214F, and the modules 218A and 218F. Similarly, the vacuum robot 242 of the transfer chamber 203 is capable of receiving/transferring the substrates 221 between the process chambers 214A, 214B, 214C, and 214D and the modules 218A and 218F.

In some embodiments, the process chambers 214A, 214B, 214C, 214D, 214E, and 214F can comprise at least an ALD chamber, a CVD chamber, a PVD chamber, an e-beam deposition chamber, and/or an electroplating, electroless (EEP) deposition chamber. Likewise, in some embodiments, one or more optional service chambers (shown as 216A and 216B) may be coupled to the buffer chamber 208. The service chambers 216A and 216B may be configured to perform other substrate processes, such as degassing, bonding, chemical mechanical polishing (CMP), substrate cleaning (preclean), wafer cleaving, etching, plasma dicing, orientation, substrate metrology, cool down, and the like.

The controller 202 controls the operation of the tool 200 using a direct control of the process chambers 214A, 214B, 214C, 214D, 214E, and 214F, and the apparatus 212, or alternatively, by controlling the computers (or controllers) associated with the process chambers 214A, 214B, 214C, 214D, 214E, and 214F, the apparatus 212, and the tool 200. In operation, the controller 202 enables data collection and feedback from the respective chambers and systems to optimize performance of the tool 200. The controller 202 generally includes a central processing unit 230, a memory 234, and a support circuit 232. The central processing unit 230 may be any form of a general-purpose computer processor that can be used in an industrial setting. The support circuit 232 is conventionally coupled to the central processing unit 230 and may comprise a cache, clock circuits, input/output subsystems, power supplies, and the like. Software routines, such as processing methods as described above may be stored in the memory 234 (e.g., nontransitory computer readable storage medium having instructions stored thereon that when executed by a processor perform a method of processing a substrate) and, when executed by the central processing unit 230, transform the central processing unit 230 into a specific purpose computer (e.g., the controller 202). The software routines may also be stored and/or executed by a second controller (not shown) that is located remotely from the tool 200.

As noted above, the inventors have provided herein improved methods and apparatus for cooling a substrate support. For example, film growth processes (e.g., PVD) typically require very high vacuum levels (e.g., 1.0E-8 Torr to about 1.0E-10 Torr for optimal film deposition). The vacuum levels, however, can be impacted by water molecules in the process chamber, which need to be pumped continuously using conventional methods and apparatus. Accordingly, the methods and apparatus described herein provide relatively low temperature heat sinking during a substrate cooling process. For example, the apparatus described herein includes a cryogenic heatsink for cooling a substrate support (e.g., electrostatic wafer chucks) and an integrated water pumping surface for improved process chamber vacuum performance. In at least some embodiments, the apparatus described herein can comprise one or more metal bellows vacuum seals for input/output cooling fluid lines and/or can comprise a welded construction with no fittings (e.g., an integrated single welded assembly).

Figure 3A:
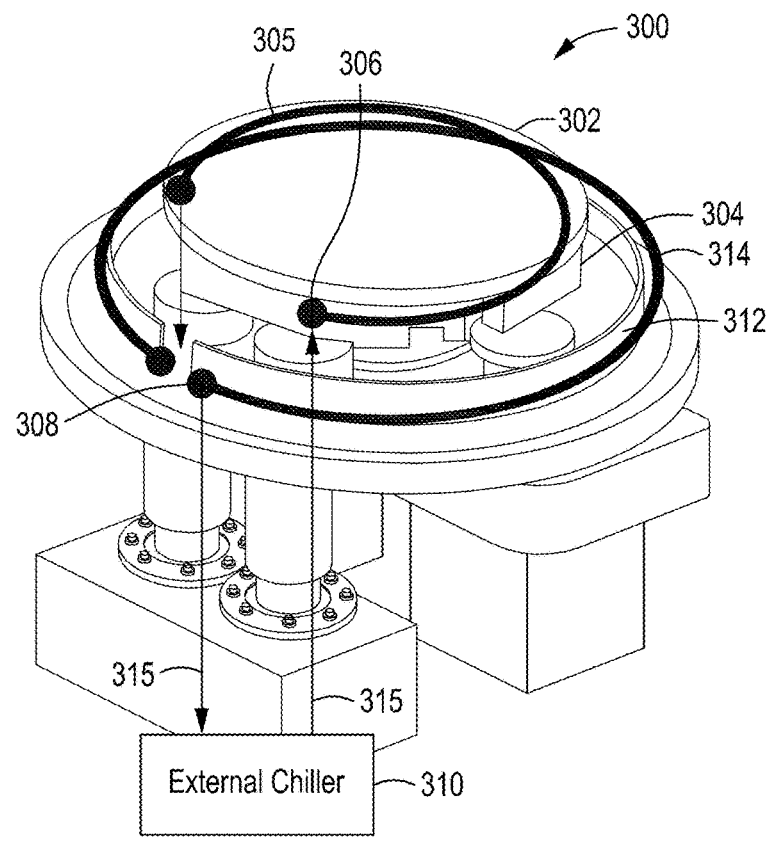
FIG. 3A is a diagram of a substrate support configured for use with the apparatus of FIG. 2, in accordance with at least some embodiments of the present disclosure.
Figure 3B:
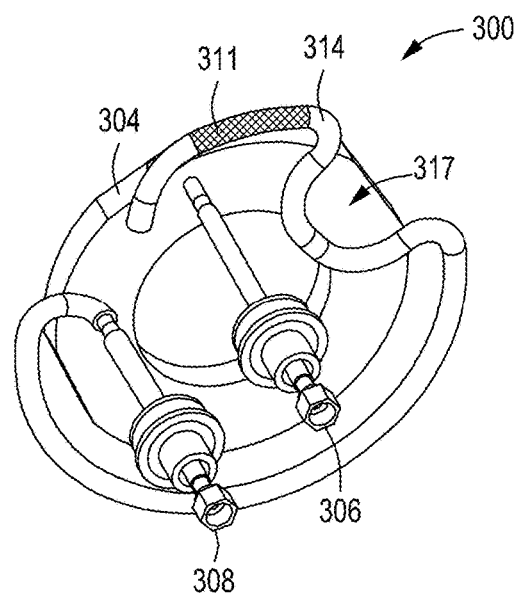
FIG. 3B is a diagram of a heat sink and a pumping ring shown without a water trap panel, in accordance with at least some embodiments of the present disclosure.
Figure 3C:
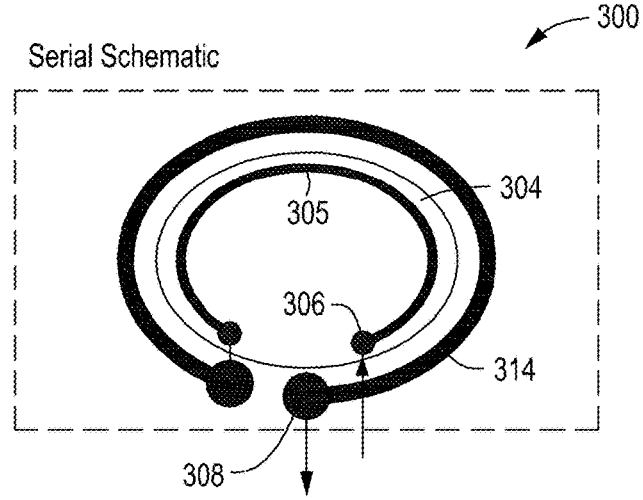
FIG. 3C is a diagram of a serial configuration for supplying a cooling fluid to the heat sink and the pumping ring of FIG. 3B, in accordance with at least some embodiments of the present disclosure.

FIG. 3A is a diagram of a substrate support configured for use with the tool 200 of FIG. 2, FIG. 3B is a diagram of a heat sink and a pumping ring shown without a water trap panel, and FIG. 3C is a diagram of a serial configuration for supplying a cooling fluid to the heat sink and the pumping ring of FIG. 3B, in accordance with at least some embodiments of the present disclosure. For example, a substrate support 300 (e.g., an electrostatic wafer pedestal) can comprise an electrostatic chuck 302. The electrostatic chuck 302 is of conventional configuration and is configured to provide, inter alia, a clamping/chucking force during operation for maintaining a substrate in a substantial fixed configuration. The electrostatic chuck 302 can be driven by a chucking power source (not shown) to develop an electrostatic force that holds the substrate to a chuck surface. Alternatively, a substrate may be retained to the substrate support by clamping, vacuum, or gravity. The electrostatic chuck 302 is disposed on top of a heat sink. For example, the heat sink can be any suitable heat exchanger capable of transferring heat generated in a processing volume to a fluid medium (e.g., air, cooling liquid, etc.) such that the heat can be dissipated away from the processing volume, thus allowing regulation of a temperature and/or pressure within the processing volume during operation. The heat sink can have one or more suitable configurations (e.g., rectangular, circular, triangular, etc. For example, in at least some embodiments, the heat sink can be configured having a generally circular/annular configuration (ring-like), e.g., a cooling ring 304. The cooling ring 304 comprises one or more cooling channels 305 (FIG. 3C) that connect to an input port 306 or an output port 308, as described in greater detail below. The input port 306 and the output port 308 are configured to connect to one or more chillers to supply one or more cooling fluids to the substrate support, as described in greater detail below.

The substrate support 300 further comprises a water trap panel 312 (FIG. 3A) comprising a pumping ring 314 (FIG. 3B shows the pumping ring 314 without the water trap panel 312 for clarity) configured to cool the water trap panel 312 such that the water trap panel 312 condenses water vapor molecules and drops a process chamber pressure during operation. For example, as noted above, water vapor molecules can be present due to cooling of the electrostatic chuck 302 and/or a substrate and can affect vacuum levels in a processing chamber during operation. Accordingly, the pumping ring 314 can be connected to the one or both of the input port 306 and the output port 308, as described in greater detail below. The water trap panel 312 and the pumping ring 314 can be similarly configured to each other and can be made from one or more materials suitable for condensing water vapor molecules. For example, the water trap panel 312 and the pumping ring 314 can have a generally rectangular, tubular, circular or annular configuration and can be made from stainless steel, aluminum, and/or copper. In at least some embodiments, the pumping ring 314 can have a generally tubular configuration and can be configured to connect (clamps, clips, nuts, bolts, etc.) to the water panel 312, which can have a generally rectangular configuration that substantially surrounds the pumping ring 314 in a circular fashion. In at least some embodiments, the water trap panel 312 and the pumping ring 314 can be made from stainless steel. Additionally, in at least some embodiments, the water trap panel 312 (and/or the pumping ring 314) can be textured (knurled) 311 (FIG. 3B) and/or comprises a plurality of fins 313 (FIG. 4B) to increase a surface area of the water trap panel 312 and, thus, increase an amount of water vapor molecules that can be condensed on the water trap panel 312. In at least some embodiments (e.g., when space in a processing chamber and/or in a substrate support is limited), the water trap panel 312 can be omitted and the pumping ring 314 can be directly used for condensing water vapor molecules. In such embodiments, the pumping ring 314 can be textured and/or comprises the plurality of fins to increase a surface area of the pumping ring 314 to increase an amount of water vapor molecules that can be condensed on the pumping ring 314. Additionally, when the pumping ring 314 is configured to be directly used for condensing water vapor molecules, one or more portions of the pumping ring 314 can be curved (or coiled) 317 to increase a surface area of the pumping ring 314 to increase an amount of water vapor molecules that can be condensed on the pumping ring 314.

A chiller 310 (e.g., an external chiller) comprises a cooling fluid line 315 (FIG. 3A) to supply one or more cooling fluids (e.g., polycold refrigerant or liquid nitrogen refrigerant) to the substrate support 300 during operation. For example, the chiller 310 can operably couple to the substrate support 300 via the cooling fluid line 315 line that connects to the cooling ring 304 and the pumping ring 314 via a serial configuration or a parallel configuration. For example, in FIGS. 3A-3C, the cooling fluid line 315 connects to the cooling ring 304 and the pumping ring 314 via the serial configuration. For example, one or more cooling fluids can leave the chiller 310 (at 1) and enter the cooling ring 304 at the input port 306 and circulate through the cooling ring 304 to cool the electrostatic chuck 302. The one or more cooling fluids can exit the cooling ring 304 and enter the pumping ring 314 (at 2). As the one or more cooling fluids circulate through the pumping ring 314 (at 3), the water trap panel 312 cools and water vapor molecules condense on the water trap panel 312 and the processing chamber pressure drops. The one or more cooling fluids can exit the pumping ring 314 from the output port 308 and return to the chiller 310 (at 5) for cooling.

In at least some embodiments, one or more metal bellows vacuum seals can be provided for the cooling fluid line 315, and the connection between the input port 306, the output port 308, the cooling ring 304, the water trap panel 312 including the pumping ring 314 can be welded together with no fittings (e.g., an integrated single welded assembly).

Figure 4A:
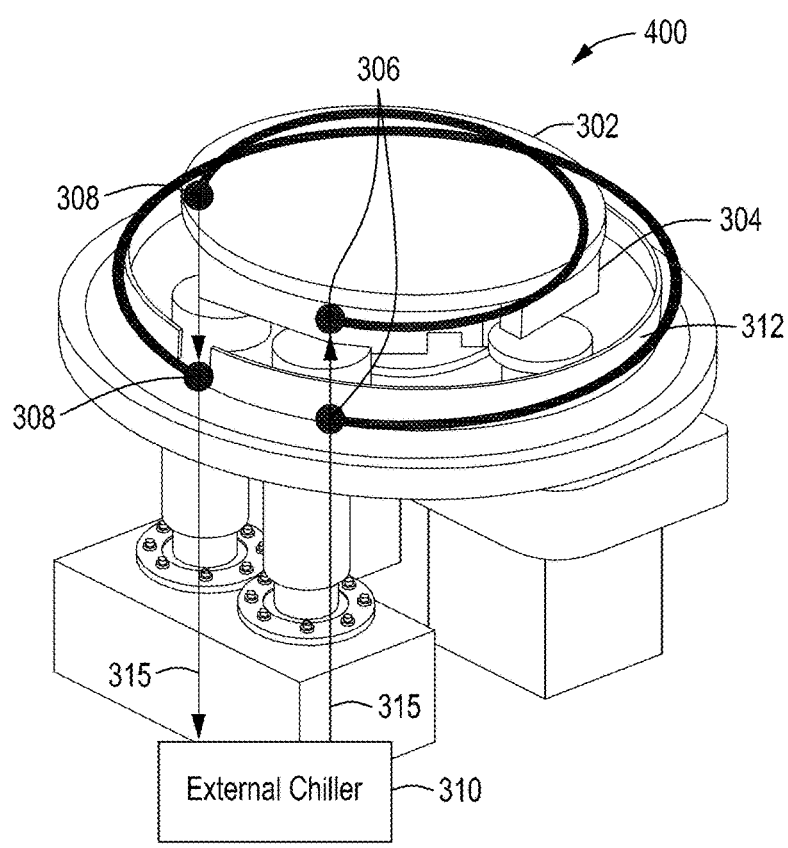
FIG. 4A is a diagram of a substrate support configured for use with the apparatus of FIG. 2, in accordance with at least some embodiments of the present disclosure.
Figure 4B:
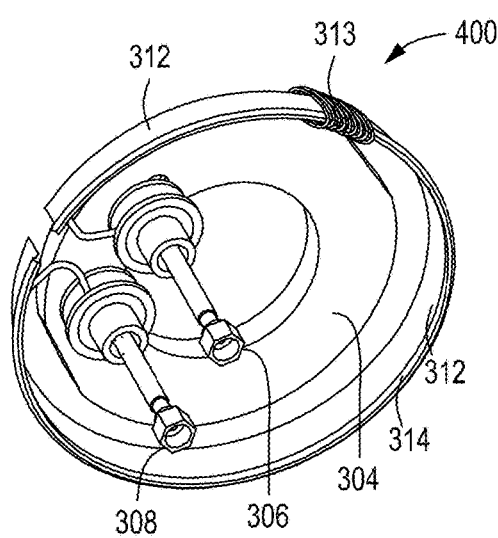
FIG. 4B is a diagram of a heat sink and a pumping ring shown with a water trap panel, in accordance with at least some embodiments of the present disclosure.
Figure 4C:
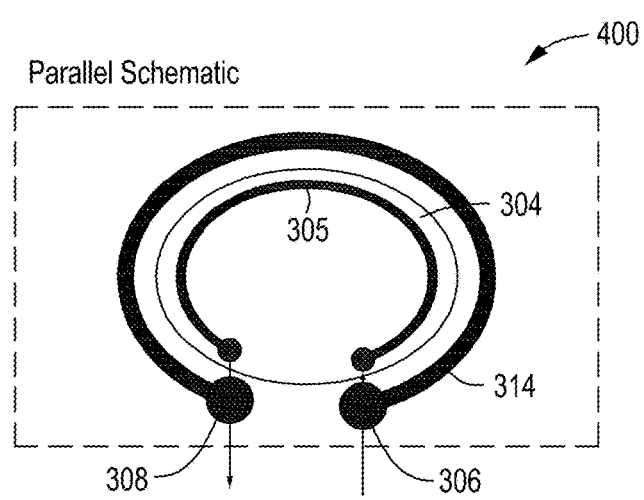
FIG. 4C is a diagram of a parallel configuration for supplying a cooling fluid to the heat sink and the pumping ring of FIG. 4B, in accordance with at least some embodiments of the present disclosure.

FIG. 4A is a diagram of a substrate support 400 configured for use with the tool 200 of FIG. 2, FIG. 4B is a diagram of a heat sink and a pumping ring shown without a water trap panel, and FIG. 4C is a diagram of a serial configuration for supplying a cooling fluid to the heat sink and the pumping ring of FIG. 4B, in accordance with at least some embodiments of the present disclosure. The substrate support 400 is substantially similar to the substrate support 300. Accordingly, only the features that are unique to the substrate support 400 are described here. For example, as noted above, the chiller 310 can operably couple to the substrate support 300 via the cooling fluid line 315 that connects to the cooling ring 304 and the pumping ring 314 via a serial configuration or a parallel configuration. For example, in FIGS. 4A-4C, the cooling fluid line 315 connects to the cooling ring 304 and the pumping ring 314 via the parallel configuration. For example, one or more cooling fluids can leave the chiller 310 (at 1). Unlike the circulation of the one or more cooling fluids in FIGS. 3A-3C, the cooling fluid line 315 splits at the input port 306 such that the one or more cooling fluids enters the cooling ring 304 and the pumping ring 314 at substantially the same time and circulates therethrough to cool the electrostatic chuck 302 (at 2) and the pumping ring 314 (at 3) to cool the water trap panel 312. Thereafter, the one or more cooling fluids can exit the cooling ring 304 and the pumping ring 314 from the output port 308 (at 4) and return to the chiller 310 (at 5) for cooling.

Figure 5:
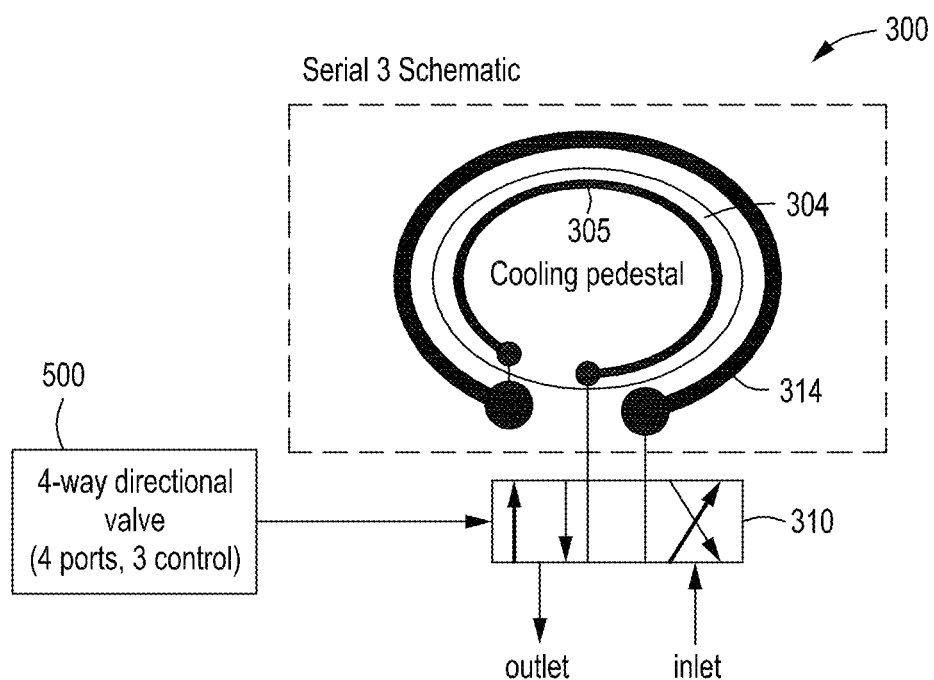
FIG. 5 is a diagram of a serial configuration for supplying a cooling fluid to the heat sink and the pumping ring of FIG. 3A, in accordance with at least some embodiments of the present disclosure.

FIG. 5 is a diagram of a serial configuration for supplying a cooling fluid to the heat sink and the pumping ring of FIG. 3A, in accordance with at least some embodiments of the present disclosure. For example, a four-way directional valve 500 (e.g., four ports, three control) can be disposed between the chiller 310 and the input port 306 and the output port 308. The four-way directional valve 500 allows the one or more cooling fluids to enter the input port 306 at the cooling ring 304 or enter the input port 306 at the pumping ring 314. Accordingly, when the four-way directional valve 500 is in a first configuration, the four-way directional valve 500 closes the input port 306 at the pumping ring 314, opens the input port 306 at the cooling ring 304, opens the output port 308 at the pumping ring 314, and closes the output port 308 at the cooling ring 304. Thus, in the first configuration, the one or more cooling fluids circulate as described above, e.g., the one or more cooling fluids first circulate through the cooling ring 304 and then circulates through the pumping ring 314. Conversely, when the four-way directional valve 500 is in a second configuration, the four-way directional valve 500 opens the input port 306 at the pumping ring 314, closes the input port 306 at the cooling ring 304, closes the output port 308 at the pumping ring 314, and opens the output port 308 at the cooling ring 304. Thus, in the second configuration, the one or more cooling fluids first circulate through the pumping ring 314 and then circulates through the cooling ring 304. When the four-way directional valve 500 is in a third configuration, only one of the cooling ring 304 or the pumping ring 314 is operable, e.g., the four-way directional valve 500 closes the input port 306 and the output port 308 at the pumping ring 314 (inoperable) and opens the input port 306 and the output port 308 at the cooling ring 304 (operable), or vice versa.

Continuing with reference to FIG. 1, initially one or more substrates, thermal modular assembly, or the like may be loaded into one or more of the Four FOUPS, such as 205A, 205B, 205C, and 205D (FIG. 2). For example, in at least some embodiments, a substrate 221 (wafer) can be loaded into FOUP 205B. The substrate can have a diameter of 150 mm, 200 mm, 300 mm, etc. The substrate 221 can be formed from germanium, silicon, silicon carbide, silicon oxide, etc. In at least some embodiments, the substrate 221 can have a 300 mm diameter and can formed from silicon. In at least some embodiments, one or more metal layers can be deposited on the substrate 221. For example, the one or more metal layers can comprise aluminum, cobalt, copper, nitride, titanium, tantalum, etc. In at least some embodiments, the substrate 221 can comprise a metal layer comprising cobalt and tungsten.

Once loaded, the factory interface robot 238 can transfer the substrate 221 from the factory interface 204 to the processing platform 201 through, for example, the load lock chamber 206A. The vacuum robot 242 can transfer the substrate 221 from the load lock chamber 206A to and from one or more of the process chambers 214A, 214B, 214C, 214D, 214E, and 214F and/or the service chambers 216A and 216B.

For example, in at least some embodiments, the vacuum robot 242 can transfer the substrate 221 from the load lock chamber 206A to the service chamber 216A where one or more of degassing, bonding, chemical mechanical polishing (CMP), substrate cleaning (preclean), wafer cleaving, etching, plasma dicing, orientation, substrate metrology, cool down can be performed. For example, in at least some embodiments, a precleaning process can be performed on the substrate 221 to remove oxide that may have formed on the metal layer.

Next, the vacuum robot 242 of the buffer chamber 208 can transfer the substrate 221 from the service chamber 216A to one of the modules 218A and 218B (e.g., for cool down).

Next, the vacuum robot 242 of the transfer chamber 203 can transfer the substrate 221 from one of the modules 218A and 218B to one of the process chambers 214A, 214B, 214C, and 214D where one or more deposition processes may be performed on the substrate 221. In at least some embodiments, the substrate 221 can be transferred to the process chamber 214A where physical vapor deposition can be performed on the substrate 221, e.g., a film growth process.

Next, at 102, the method 100 comprises supplying a cooling fluid through a heat sink coupled to a substrate support for cooling the substrate support. For example, during PVD (which can be conducted at 1.0E-8 Torr to about 1.0E-10 Torr), under control of the controller 202, the one or more cooling fluids can be supplied to the substrate support (e.g., the substrate support 300 or the substrate support 400). In at least some embodiments, PVD can be conducted at about 1.0E-9 Torr.

Next, at 104, the method 100 comprises supplying the cooling fluid through a pumping ring of a water trap panel to cool the water trap panel for condensing water vapor molecules on the water trap panel to drop a process chamber pressure, wherein the cooling fluid is supplied via one of a serial configuration or a parallel configuration. For example, as noted above, when the substrate support 300 is used, the one or more cooling fluids can be circulated as described with respect to FIGS. 3A-3C or FIG. 5. Conversely, when the substrate support 400 is used, the one or more cooling fluids can be circulated as described with respect to FIGS. 4A-4C.

Unlike conventional methods and apparatus that use an external cryogenic cold head (which can be located on one side of a process chamber), the methods and apparatus described herein use the water trap panel 312 that is cooled via the pumping ring that taps into cryogenically cooled fluid already being used in the heat sink (e.g., the cooling ring 304) for cooling a substrate. Additionally, the generally circular shape and position of the water trap panel 312 (e.g., adjacent and surrounding the electrostatic chuck) promotes symmetric pumping behavior that improves substrate (wafer) film uniformity by producing symmetric and equal film characteristics throughout the surface of the substrate.

While the foregoing is directed to embodiments of the present disclosure, other and further embodiments of the disclosure may be devised without departing from the basic scope thereof.

The invention claimed is:

1. An apparatus for processing a substrate, comprising:
a process chamber configured to process a substrate;
a substrate support comprising a heat sink configured to cool the substrate support during operation and a water trap panel comprising a pumping ring configured to cool the water trap panel such that the water trap panel condenses water vapor molecules and drops a process chamber pressure during operation; and
a chiller operably coupled to the substrate support and configured to supply a cooling fluid to the substrate support via a cooling fluid line that connects to the heat sink and the pumping ring via a serial configuration or a parallel configuration.

2. The apparatus of claim 1, wherein the cooling fluid line connects to the heat sink and the pumping ring via the serial configuration.

3. The apparatus of claim 1, wherein the cooling fluid line connects to the heat sink and the pumping ring via the parallel configuration.

4. The apparatus of claim 1, wherein the cooling fluid is at least one of polycold refrigerant or liquid nitrogen refrigerant.

5. The apparatus of claim 1, wherein the water trap panel is at least one of textured or comprises a plurality of fins.

6. The apparatus of claim 1, wherein the chiller comprises a four-way directional valve configured for use with the serial configuration.

7. The apparatus of claim 1, wherein the process chamber is configured to process the substrate in a vacuum.

8. The apparatus of claim 7, wherein a pressure of the vacuum is about 1.0E-8 Torr to about 1.0E-10.

9. The apparatus of claim 1, wherein the heat sink comprises an annular configuration.

10. A method of processing a substrate, comprising:
supplying a cooling fluid through a heat sink coupled to a substrate support for cooling the substrate support; and
supplying the cooling fluid through a pumping ring of a water trap panel to cool the water trap panel for condensing water vapor molecules on the water trap panel to drop a process chamber pressure,
wherein the cooling fluid is supplied via one of a serial configuration or a parallel configuration.

11. The method of claim 10, wherein the cooling fluid is supplied via the serial configuration.

12. The method of claim 10, wherein the cooling fluid is supplied via the serial configuration.

13. The method of claim 10, wherein the cooling fluid is at least one of polycold refrigerant or liquid nitrogen refrigerant.

14. The method of claim 10, wherein the water trap panel is at least one of textured or comprises a plurality of fins.

15. The method of claim 10, further comprising using a four-way directional valve that is configured for use with the serial configuration.

16. The method of claim 10, wherein the substrate is processed in a vacuum.

17. The method of claim 16, wherein a pressure of the vacuum is about 1.0E-8 Torr to about 1.0E-10.

18. The method of claim 10, wherein the heat sink comprises an annular configuration.

19. A nontransitory computer readable storage medium having instructions stored thereon that when executed by a processor perform a method of processing a substrate, comprising:
supplying a cooling fluid through a heat sink coupled to a substrate support for cooling the substrate support; and
supplying the cooling fluid through a pumping ring of a water trap panel to cool the water trap panel for condensing water vapor molecules on the water trap panel to drop a process chamber pressure,
wherein the cooling fluid is supplied via one of a serial configuration or a parallel configuration.

20. The nontransitory computer readable storage medium of claim 19, wherein the cooling fluid is supplied via the serial configuration.

* * * * *